(12) United States Patent
Takeuchi

(10) Patent No.: US 7,576,314 B2
(45) Date of Patent: Aug. 18, 2009

(54) SOLID-STATE IMAGING DEVICE AND METHOD FOR MANUFACTURING THE SAME

(75) Inventor: Yasuo Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 11/480,048

(22) Filed: Jun. 30, 2006

(65) Prior Publication Data
US 2007/0007443 A1 Jan. 11, 2007

(30) Foreign Application Priority Data
Jul. 6, 2005 (JP) .............. 2005-197975

(51) Int. Cl.
G01J 3/50 (2006.01)
H05B 33/00 (2006.01)

(52) U.S. Cl. ............ 250/226; 257/440; 348/277

(58) Field of Classification Search ......... 250/208.1, 250/226; 348/272–277; 356/402; 257/440
See application file for complete search history.

(56) References Cited

U.S. PATENT DOCUMENTS 4,252,879 A * 2/1981 Inoue et al. ............... 430/9
4,786,148 A * 11/1988 Sekimura et al. .......... 349/106
6,734,031 B2 5/2004 Shizukuishi
7,176,446 B1 * 2/2007 Wiedemann ............ 250/226
2005/0170550 A1 * 8/2005 Seki et al. ................ 438/73

FOREIGN PATENT DOCUMENTS

JP 2002-314058 10/2002

* cited by examiner

Primary Examiner—Thanh X Luu
Assistant Examiner—Tony Ko
(74) Attorney, Agent, or Firm—Hamre, Schumann, Mueller & Larson, P.C.

(57) ABSTRACT

A solid-state imaging device includes: a plurality of light-receptive elements arranged in a matrix in a semiconductor substrate; and a plurality of color filters corresponding to the plurality of light-receptive elements, respectively. The color filters include a colored film formed by depositing colored particles at an upper layer of the plurality of light-receptive elements, and a resin with which gaps between the colored particles are filled. The resin with which the gaps between the colored particles are filled may be transparent or be colored.

2 Claims, 6 Drawing Sheets

SOLID-STATE IMAGING DEVICE AND METHOD FOR MANUFACTURING THE SAME

BACKGROUND OF THE INVENTION

1. Field of the Invention

The present invention relates to a solid-state imaging device and a method for manufacturing the same.

2. Description of Related Art

In recent years, solid-state imaging devices have been used for imaging devices of a digital still camera and a digital video camera and for image reading devices of a facsimile, a scanner and a copying machine, and the demands therefor have expanded. As major solid-state imaging devices, MOS-type solid-state imaging devices and CCD (charge-coupled device) type solid-state imaging devices are known. Recently, these solid-state imaging devices often are provided with color filters in order to capture a color image.

Figure 5:
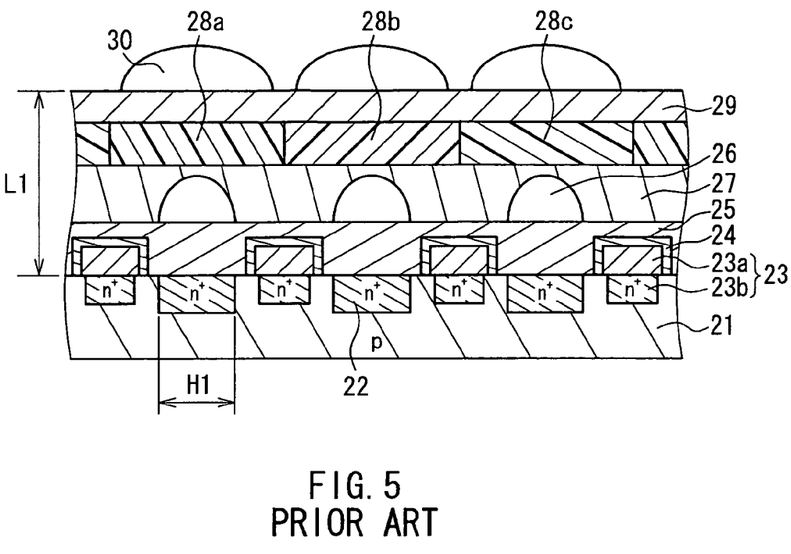
FIG. 5 is a partial cross-sectional view showing the configuration of a conventional solid-state imaging device.

FIG. 5 is a partial cross-sectional view showing the configuration of a conventional solid-state imaging device. The solid-state imaging device of FIG. 5 is a CCD type solid-state imaging device. As shown in FIG. 5, the solid-state imaging device includes a plurality of photodiodes 22 that are arranged in a matrix in a semiconductor substrate 21. A vertical transfer unit 23 is provided at each column of the photodiodes 22 in the vertical direction.

In the example of FIG. 5, the semiconductor substrate 21 is a p-type silicon substrate, and the photodiodes 22 are n-type semiconductor regions. Each vertical transfer unit 23 includes a channel region 23b formed along a column of the photodiodes 22 in the vertical direction and a transfer electrode 23a provided on the channel region 23b. The transfer electrode 23a is covered with an insulation film 24.

Further, at an upper layer of each photodiode 22 an internal microlens 26 is formed via a first planarizing film 25. Further, at an upper layer of the internal microlens 26 color filters 28a to 28c are formed via a second planarizing film 27. The color filters 28a to 28c are formed corresponding to the photodiodes 22, respectively, and are arranged in a matrix so as to constitute a color filter array.

In the example of FIG. 5, the color filter 28a is a green (G) color filter, the color filter 28b is a blue (B) color filter and the color filter 28c is a red (R) color filter. One color filter corresponds to a light-receptive face of one photodiode 22, so that only one of red light, blue light and green light is incident on each photodiode 22.

Note here that, instead of such a primary-colors filter, a complementary-colors filter composed of the combination of cyan (C), magenta (MG), yellow (Y) and green (G) may be used. A method for forming the color filter 28a to 28c includes a staining method, a photoresist method or the like. A resist employed in the latter photoresist method includes a pigment dispersant resist, a dye dispersant resist or the like.

Further, at an upper layer of the color filter 28a to 28c a microlens 30 is formed via a third planarizing film 29, where a diameter of the microlens 30 is larger than that of the internal microlens 26. The microlens 30 also is formed corresponding to each photodiode 22, and is arranged in a matrix. In the solid-state imaging device of FIG. 5, the external light is gathered in two steps by means of the microlens 30 and the internal microlens 26, and then is incident on each photodiode 22. Therefore, the solid-state imaging device of FIG. 5 is devised so that the sensitivity to the light incident in a slanting direction can be improved.

Meanwhile, in the field of solid-state imaging devices, there is a tendency to increase the number of pixels year by year in order to improve their resolution. If the increase in the number of pixels results in an increase in the size of the solid-state imaging device, it becomes difficult to downsize a product that comes with such a solid-state imaging device. Therefore, it has been required to decrease the size of the pixels. It is expected that such a tendency will progress further in the future.

Figure 6:
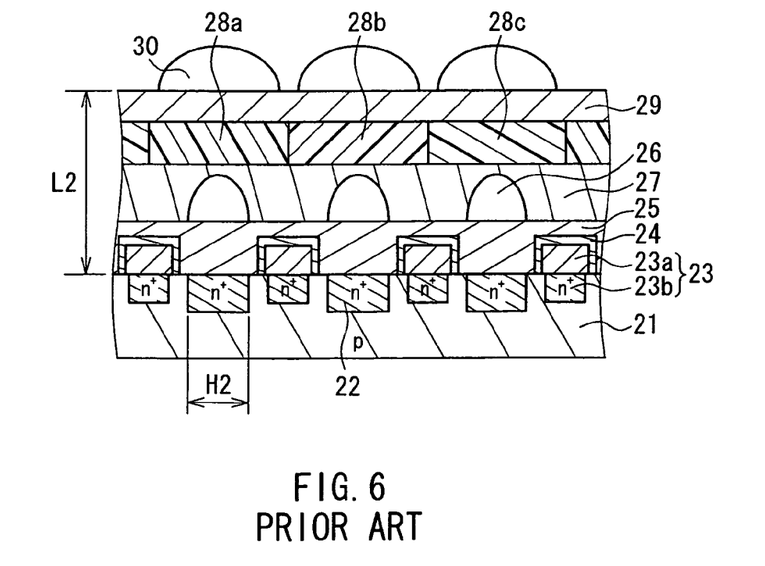
FIG. 6 is a partial cross-sectional view showing the configuration of a solid-state imaging device that is devised to increase the number of pixels and decrease the pixels in size as compared with the example of FIG. 5.

FIG. 6 is a partial cross-sectional view showing the configuration of a solid-state imaging device that is devised to increase the number of pixels and decrease the size of the pixels as compared with the example of FIG. 5. The configuration of the solid-state imaging device of FIG. 6 is similar to the configuration of FIG. 5 except that the number of pixels is increased and the size of the pixels is reduced. Since the pixels are decreased in size in the example of FIG. 6, the length H2 of one side of the photodiode 22 is shorter than the length H1 of one side of the photodiode of FIG. 5 (H2<H1).

However, since there is a limit to making the respective planarizing films and the color filter thinner, the length L2 between a photodiode 22 and a microlens 30 in the example of FIG. 6 becomes substantially equal to the length L1 between a photodiode 22 and a microlens 30 in the example of FIG. 5 (L2≈L1). Thus, the photodiode 22 of FIG. 6 will have a F value of the microlens 30 smaller than that of the photodiode of FIG. 5, thus degrading the sensitivity to the light incident in a slanting direction.

In order to cope with such a problem, JP 2002-314058 A for example proposes the formation of a color filter using a dry film formation method. As one example of the dry film formation method, an evaporation method is known, in which colored particles such as pigment particles or dye particles are deposited by evaporation at the formation region of the color filter. According to the dry film formation method, a color filter can be made thinner than in the conventional ones, so that the distance between a photodiode 22 and a lens 30 can be shortened, and therefore the above-stated problem can be solved.

However, in the case of a dry film formation method, a gap will be formed inside a color filter, thus causing problems of the degradation in a sensitivity and a S/N ratio of a solid-state imaging device. These problems will be described below with reference to FIG. 7.

Figure 7A:
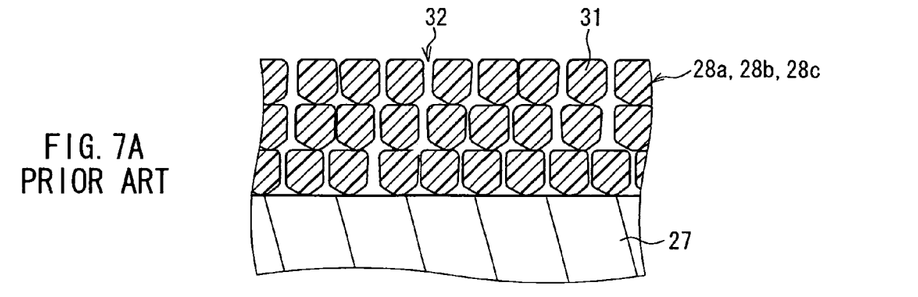
Figure 7B:
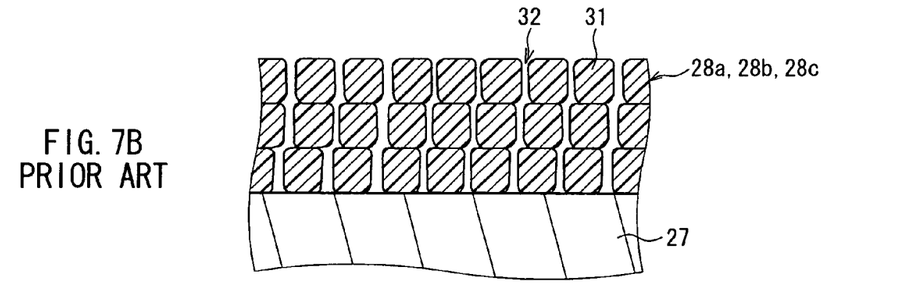
Figure 7C:
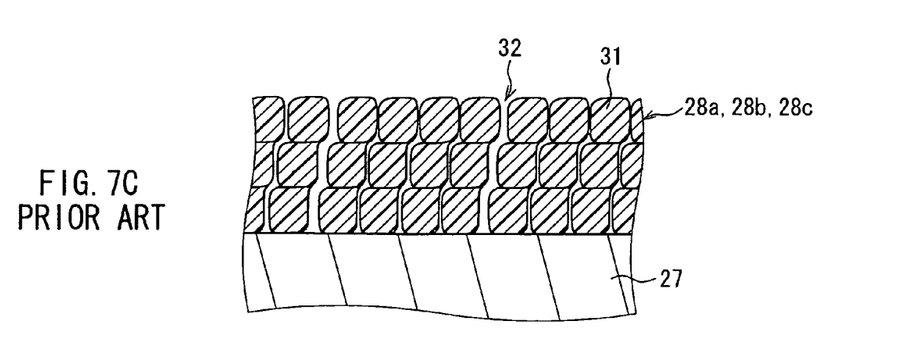

FIG. 7 is a partial cross-sectional view of a conventional color filter formed by a dry film formation method. FIGS. 7A to C show examples where the deposition states of colored particles are different from each other. FIGS. 7A to C illustrate only the lines appealing in their cross section.

As shown in FIGS. 7A to C, the color filter 28a to 28c is an aggregation of a large number of colored particles 31, and in the case of the dry film formation method used, a gap 32 occurs between the deposited colored particles 31. Therefore, the light incident on the color filter 28a to 28c will be scattered at the gap 32. As a result, the sensitivity and the S/N ratio of the solid-state imaging device will be degraded as described above.

SUMMARY OF THE INVENTION

Therefore, with the foregoing in mind, it is an object of the present invention to provide a solid-state imaging device capable of suppressing the degradation in a sensitivity and a S/N ratio and to provide a method for manufacturing the same.

In order to attain the above-mentioned object, a solid-state imaging device of the present invention includes: a plurality of light-receptive elements arranged in a matrix in a semiconductor substrate; and a plurality of color filters corresponding to the plurality of light-receptive elements, respectively. The color filters include a colored film formed by depositing colored particles at an upper layer of the plurality of light-receptive elements, and a resin with which gaps between the colored particles are filled.

Further, in order to attain the above-mentioned object, a method for manufacturing a solid-state imaging device of the present invention, the solid-state imaging device including a plurality of light-receptive elements formed in a matrix in a semiconductor substrate; and a plurality of color filters corresponding to the plurality of light-receptive elements, respectively, the method includes the steps of: (a) forming a colored film by depositing colored particles at respective formation regions of the plurality of color filters; and (b) filling gaps between the colored particles with a resin.

With the above-stated features, according to the present invention, cavities in the color filters are filled with a resin, so that the scatter of the incident light on the color filters can be suppressed. For that reason, a solid-state imaging device with a higher sensitivity and a higher S/N ratio can be obtained as compared with the conventional ones.

These and other advantages of the present invention will become apparent to those skilled in the art upon reading and understanding the following detailed description with reference to the accompanying figures.

BRIEF DESCRIPTION OF THE DRAWINGS

FIG. 1 is a partial cross-sectional view showing partially the configuration of a solid-state imaging device of one embodiment in the present invention, where FIGS. 1A to C show examples where the deposition states of colored particles are different from each other.

FIG. 2 is a cross-sectional view showing a method for manufacturing a solid-state imaging device of one embodiment in the present invention, where FIGS. 2A to D show a series of major manufacturing steps, respectively.

FIG. 7 is a partial cross-sectional view of a conventional color filter formed by a dry film formation method, where FIGS. 7A to C show examples where the deposition states of colored particles are different from each other.

DETAILED DESCRIPTION OF THE INVENTION

A solid-state imaging device of the present invention includes: a plurality of light-receptive elements arranged in a matrix in a semiconductor substrate; and a plurality of color filters corresponding to the plurality of light-receptive elements, respectively. The color filters include a colored film formed by depositing colored particles at an upper layer of the plurality of light-receptive elements, and a resin with which gaps between the colored particles are filled.

In the above-stated solid-state imaging device of the present invention, the colored particles may include at least one of pigment particles and dye particles. In the above-stated solid-state imaging device of the present invention, the resin with which the gaps between the colored particles are filled may be transparent or be colored. According to the above-stated solid-state imaging device of the present invention, spectral characteristics of the color filters can be adjusted by adjusting the color of the resin for filling between the pigment particles.

In the above-stated solid-state imaging device of the present invention, preferably, the color filters are formed inside and outside of an effective pixel region of the solid-state imaging device, and in the color filters located outside of the effective pixel region, a resin with which gaps between the colored particles are filled is colored in a complementary color or an opposed color of a color of the colored particles. With this embodiment, the color filters located outside of the effective pixel region can function as a light-shield region, and therefore the occurrence of flare can be suppressed.

Further, in the above-stated solid-state imaging device of the present invention, preferably, the plurality of color filters are arranged in a matrix so as to form a color filter array. The color filter array includes a lattice-like light-shield region that is formed along a border between adjacent color filters, and the light-shield region includes a colored film formed by depositing colored particles between the adjacent color filters and a resin with which gaps between the colored particles are filled, the resin being colored in a complementary color or an opposed color of a color of the colored particles. With this embodiment, a lattice-like light shield region can be formed easily. Further, this lattice-like light shield region can suppress the occurrence of mixed colors resulting from the stray light from an adjacent pixel, and therefore the miniaturization of pixel size can be facilitated.

A method for manufacturing a solid-state imaging device of the present invention, the solid-state imaging device including a plurality of light-receptive elements formed in a matrix in a semiconductor substrate and a plurality of color filters corresponding to the plurality of light-receptive elements, respectively, includes the steps of: (a) forming a colored film by depositing colored particles at respective formation regions of the plurality of color filters; and (b) filling gaps between the colored particles with a resin.

In the above-stated solid-state imaging device manufacturing method of the present invention, the colored particles may include at least one of pigment particles and dye particles. Further, in the above-stated solid-state imaging device manufacturing method of the present invention, in the step (a), the colored particles may be deposited at the formation regions by any one of evaporation, sputtering and ion plating. In this case, an increase in thickness of the colored film can be suppressed.

In the above-stated solid-state imaging device manufacturing method of the present invention, in the step (b), the resin may be applied on the colored film, and gaps between the colored particles may be filled with the applied resin using capillary action. Further, in the step (b), the resin may be applied on the colored film, and a differential pressure may be generated between inside and outside of the colored film, whereby gaps between the colored particles are filled with the applied resin.

Embodiments

Figure 1A:
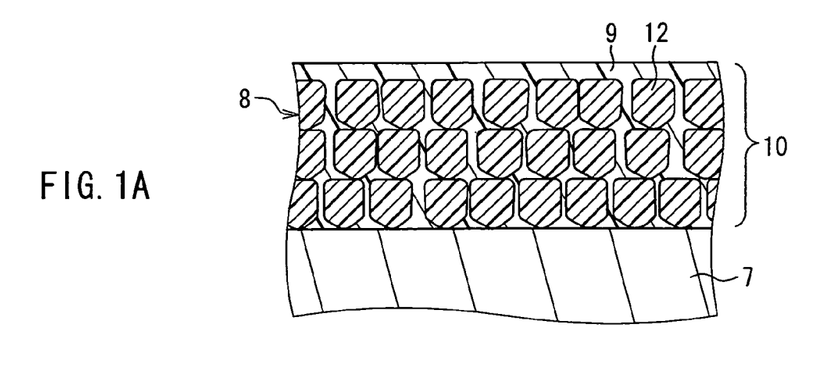
Figure 1B:
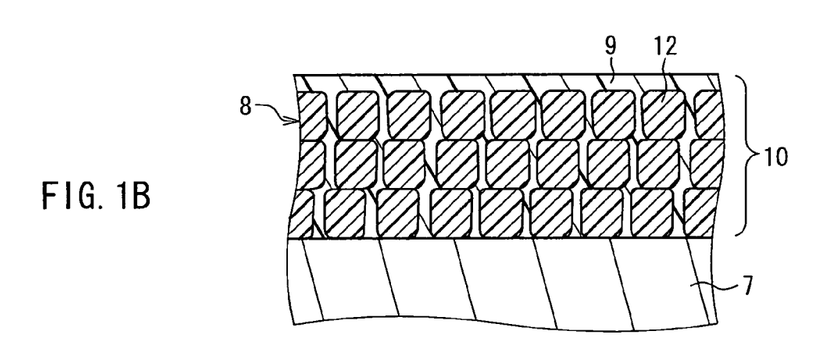
Figure 1C:
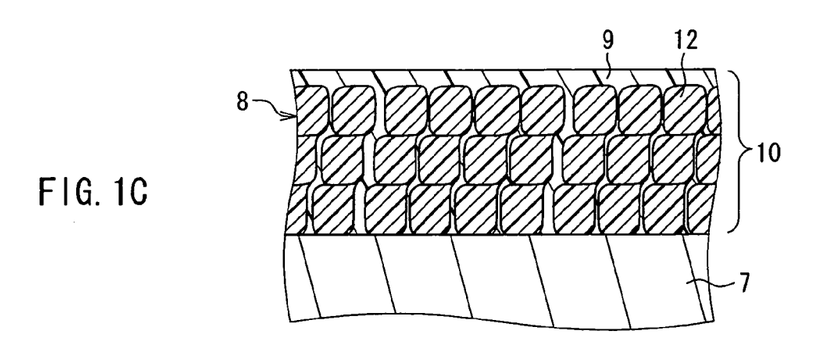

The following describes a solid-state imaging device and a method for manufacturing a solid-state imaging device according to embodiments of the present invention, with reference to FIG. 1 and FIG. 2. Firstly, the configuration of the solid-state imaging device of the present embodiment will be described below, with reference to FIG. 1. FIG. 1 is a partial cross-sectional view showing partially the configuration of the solid-state imaging device of one embodiment in the present invention, where FIGS. 1A to C show examples where the deposition states of colored particles are different from each other. FIGS. 1A to C illustrate only the lines appearing in their cross section.

As shown in FIGS. 1A to C, also in the present embodiment, a color filter 10 is formed at an upper layer of photodiodes serving as light-receptive elements in a similar manner to the conventional examples shown in FIG. 5 and FIG. 6 in the above section concerning the related art (see FIG. 2). The color filter 10 is formed corresponding to each of the plurality of photodiodes.

However, in the present embodiment, the configuration of the color filter 10 is different from that of the conventional example shown in FIG. 7 in the above-stated related art. As shown in FIGS. 1A to C respectively, the color filter 10 has a colored film 8 and a resin 9 with which a gap between colored particles 12 is filled. The colored film 8 is formed by depositing the colored particles 12 by a dry film formation method.

In this way, in the solid-state imaging device of the present embodiment, a cavity in the color filter 10 (a gap between the colored particles 12) is filled with the resin 9. This can prevent the light incident on the color filter 10 from being scattered. As a result, according to the solid-state imaging device of the present embodiment, the sensitivity and the S/N ratio can be enhanced as compared with those of the conventional ones.

Incidentally, the solid-state imaging device of the present embodiment is configured similarly to the conventional solid-state imaging devices of FIG. 5 and FIG. 6 except for the configuration of the color filter 10. In FIG. 1, layers above the color filter 10 are omitted. Reference numeral 7 denotes a second planarizing film (see FIG. 2) with which an internal lens (see FIG. 2) is covered.

The following describes a method for manufacturing a solid-state imaging device of the present invention, with reference to FIG. 2. FIG. 2 is a cross-sectional view showing the method for manufacturing a solid-state imaging device of one embodiment in the present invention, where FIGS. 2A to D show a series of major manufacturing steps, respectively. As a result of implementing the respective steps of FIG. 2, the solid-state imaging device of the present embodiment shown in FIG. 1 can be obtained.

Figure 2A:
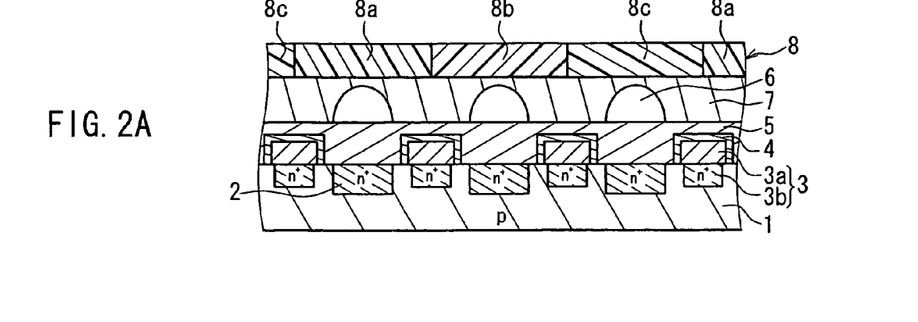

Firstly, as shown in FIG. 2A, photodiodes 2 and channel regions 3b are formed with respect to a semiconductor substrate 1, where the photodiodes 2 are arranged in a matrix and a channel region 3b is arranged along a column of the photodiodes 2 in the vertical direction. In the present embodiment, the semiconductor substrate 1 is a p-type silicon substrate, and the photodiodes 2 and the channel regions 3b are n-type semiconductor regions.

Next, a transfer electrode 3a is formed on a channel region 3b in the semiconductor substrate 1, and an insulation film 4 is formed for covering the transfer electrode 3a. Thereby, a vertical transfer unit 3 is completed, whereby an electrical charge stored in a photodiode 2 can be transferred in the vertical direction. Next, an insulation film is formed, with which the photodiodes 2 and the vertical transfer units 3 are coated. This insulation film is planalized so as to form a first planarizing film 5. Internal microlenses 6 and a second planarizing film 7 further are formed on the first planarizing film 5 in this stated order.

Next, colored particles (see FIG. 1) are deposited on the second planarizing film 7, whereby a colored film 8 is formed. In the present embodiment, pigment particles are used for the colored particles. Note here that in the present embodiment the colored particles are not limited to the pigment particles. The colored particles may be dye particles or particles containing both of the pigment particles and the dye particles.

The colored particles may be deposited by any one of an evaporation method, a sputtering method and an ion plating method. Among them, an evaporation method preferably is used in the present embodiment, because pigment particles are used as the colored particles as described above. This is because, according to an evaporation method, since pigments are heated to sublimate, pigment particles can be deposited without destroying the pigment configuration.

In the present embodiment, the colored film 8 is composed of three types of colored films 8a, 8b and 8c in different colors. More specifically, the colored film 8a is formed with green colored particles. The colored film 8b is formed with blue colored particles. The colored film 8c is formed with red colored particles.

Note here that the types of the colored film 8 are not limited to three types, and three or more types may be used. The colored film 8 may be in colors other than green, blue and red. For instance, the colored film may be composed of the colored films in cyan (C), magenta (MG), yellow (Y) and green (G).

In the case where pigment particles are used as the colored particles in the present embodiment, organic pigments such as anthraquinone, diketopyrrolopyrrole, phthalocyanine and dimethylquinacridon can be used for example as the pigment particles. Among them, the colored film 8c in red (R) particularly preferably is formed with organic pigments such as anthraquinone and diketopyrrolopyrrole. The colored film 8b in blue (B) preferably is formed with organic pigments such as phthalocyanine. The colored film in magenta (MG) preferably is formed with organic pigments such as dimethylquinacridon.

In the case where dye particles are used as the colored particles in the present embodiment, stilbene-based dyes can be used for example as the dye particles. Particularly, the stilbene-based dyes preferably are used for forming the colored film in yellow (Y).

Figure 2B:
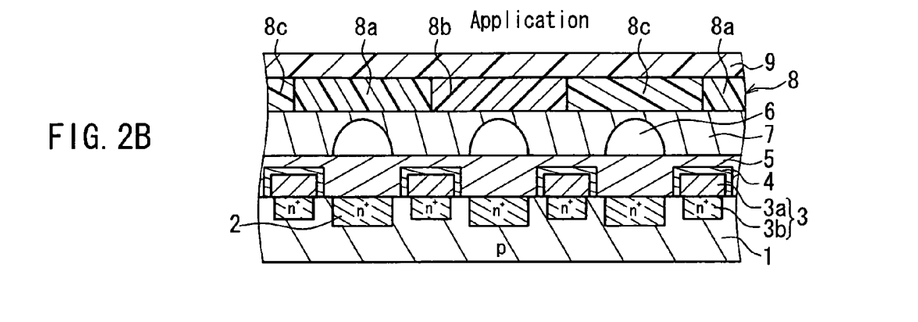

Next, as shown in FIG. 2B, a resin 9 is applied on the colored film 8 (the colored film 8a to 8c). A method for applying the resin 9 includes various types of printing methods, die-coating methods, spin-coating methods and the like. As the resin 9, an acrylic-based resin, an epoxy-based resin, a urethane-based resin or the like is available. Among them, an acrylic-based resin preferably is used, because the acrylic-based resin is transparent and can be molded easily by irradiation with UV rays or by heating.

The resin 9 preferably is applied without being dissolved in any organic solvent. This is because, in the case where the resin 9 is dissolved in an organic solvent, the solvent component will evaporate after application and drying of the resin, and therefore if the volume of the resin 9 applied is about the same as the volume of the gap as a whole, there is a risk that the gap cannot be filled completely after drying. In addition, a portion where the solvent component evaporates might remain as a void. However, if the applied film thickness of the resin 9 is made larger with consideration given to the degree to which the film becomes thinner after evaporation of the solvent component, the resin 9 dissolved in an organic solvent may be applied depending on the application method.

In the example of FIG. 2B, a transparent resin is used as the resin 9. However, a colored resin may be used. In the case where a colored resin is used as the resin 9, spectral characteristics of the color filters can be adjusted. For instance, as the resin 9 allowing for permeation into the red colored film 8c and the green colored film 8a, a resin colored in yellow can be used. As the resin 9 allowing for permeation into the blue colored film 8b, a resin colored in violet can be used.

Figure 2C:
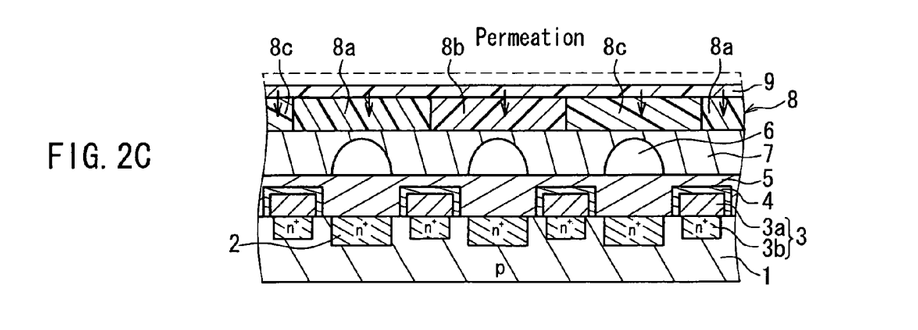

Next, as shown in FIG. 2C, the applied resin 9 is allowed to permeate into the colored film 8, so that gaps (see FIG. 1) between the colored particles formed in the colored film 8 can be filled with the resin 9. More specifically, the resin 9 applied is allowed to stand still for a while. The resin 9 applied will permeate into the gaps between the colored particles by capillary action. At this time, the semiconductor substrate 1 preferably is heated at a degree of a temperature where the resin 9 is not cured, e.g., at about 100° C. By the heating, the viscosity of the resin 9 applied is decreased, thus improving the fluidity of the resin 9, and therefore the resin 9 easily can permeate into the gaps between the colored particles as compared with the case of not heating.

Further, in the step of FIG. 2C, in order to enhance the filling rate of the applied resin 9 into the colored film 8, a differential pressure preferably is generated between the inside and the outside of the colored film 8. More specifically, the atmosphere of the semiconductor substrate 1 is set at an atmospheric pressure or below by a so-called vacuum impregnating method. Thereby, the gaps between the colored particles easily can release a gas accumulated therein, and therefore the resin 9 can permeate into smaller gaps.

Figure 2D:
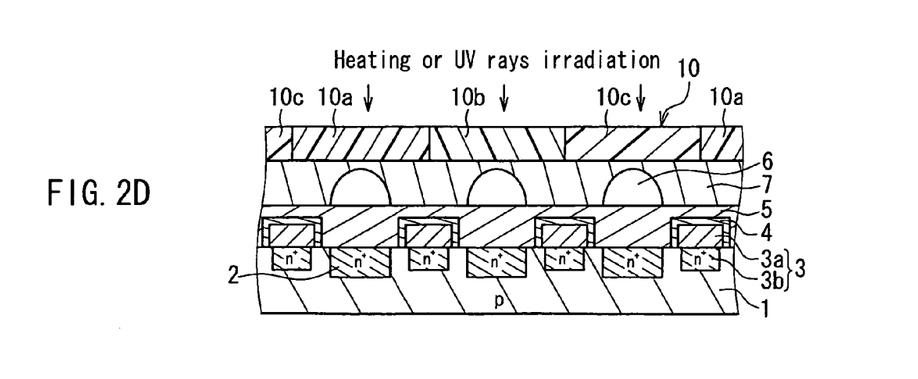

Thereafter, as shown in FIG. 2D, the colored film 8 and the resin 9 are cured by heating or by irradiation with UV rays, whereby a color filter 10 can be obtained. In the example of FIG. 2D, the color filter 10 is composed of a green (G) color filter 10a, a blue (B) color filter 10b and a red (R) color filter 10c. The color filters 10a to 10c are formed corresponding to the photodiodes, respectively, and are arranged in a matrix so as to form a color filter array.

After the completion of the color filter 10, a third planarizing film, microlenses and the like are formed as shown in FIG. 5 and FIG. 6 in the above section concerning the related art. Thereby, a solid-state imaging device is completed. In this way, according to the present embodiment, the gaps between the colored particles in the colored film easily can be filled with a resin, so that the solid-state imaging device according to the present embodiment can be obtained at a low cost.

Further, according to the method for manufacturing a solid-state imaging device of the present embodiment, a light-shield region can be formed easily in the solid-state imaging device. Referring again to FIG. 1, this will be described below. That is, a resin colored in a complementary color or an opposed color of a color of the colored particles 12 may be used as the resin 9 for filling the gaps between the colored particles 12, whereby the region filled with this resin can be in a blackish color and serve as a light-shield region.

For instance, in the case where the colored particles 12 are red, a resin 9 in a greenish color may be used. In the case where the colored particles 12 are green, a resin 9 in a reddish color may be used, and in the case where the colored particles 12 are blue, a resin 9 in an orangish color may be used.

Figure 3:
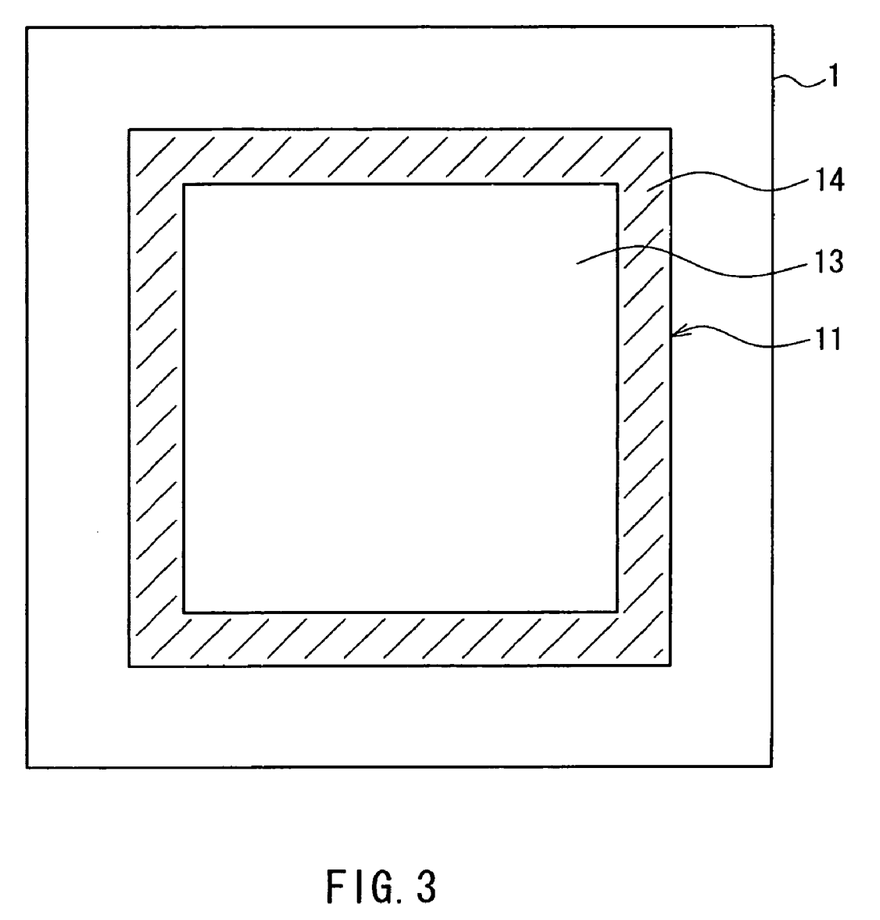
FIG. 3 is a plan view of an exemplary solid-state imaging device provided with a light-shield film according to one embodiment of the present invention.
Figure 4:
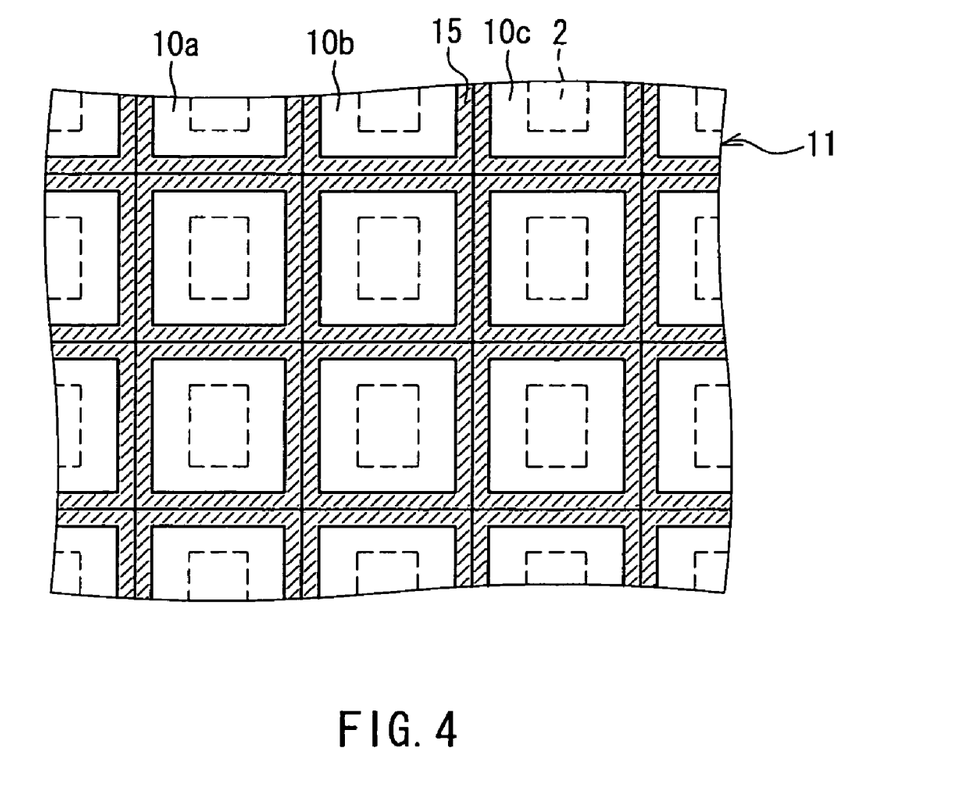
FIG. 4 is a plan view of another exemplary solid-state imaging device provided with a light-shield region according to one embodiment of the present invention.

The following describes an example of a light-shield region being formed more specifically, with reference to FIG. 3 and FIG. 4. FIG. 3 is a plan view of one example of a solid-state imaging device provided with a light-shield film according to one embodiment of the present invention. In FIG. 3, upper layers of the color filter array 11 are omitted.

As shown in FIG. 3, the color filter array 11 in this example extends beyond an effective pixel region 13 of the solid-state imaging device. That is to say, the color filter is formed not only inside the effective pixel region 13 of the solid-state imaging device but also outside of the region. In FIG. 3, reference numeral 14 denotes the color filter formed outside of the effective pixel region 13.

In this example, the resin for filling the gaps between the colored particles in the color filter 14 formed outside of the effective pixel region 13 is colored in a complementary color or an opposed color of the color of the colored particles. Therefore, the color filter 14 can serve as the light-shield region at the outside of the effective pixel region 13.

Thus, the example of FIG. 3 can prevent the incident light from being reflected by a large number of metal wirings formed on the periphery of the effective pixel region. Therefore, a phenomenon in which the light reflected by these metal wirings is reflected again by a glass portion of a package of the solid-state imaging device and by a lens incorporated in the package can be prevented, thus suppressing such light from being incident on the effective pixel region. Thereby the occurrence of flare can be suppressed.

The color filter 14 can be formed by a lift-off method, after the colored film is formed inside and outside of the effective pixel region 13. More specifically, a resist pattern having an aperture corresponding to the formation region of the color filter 14 is formed firstly on the colored film. Next, a resin is applied at the aperture portion of the resist pattern (see FIG. 2B), and this resin further is allowed to permeate into the colored film (see FIG. 2C). Thereafter, the resin is cured (see FIG. 2D).

FIG. 4 is a plan view of another exemplary solid-state imaging device provided with a light-shield region according to one embodiment in the present invention. In FIG. 4, a part of the effective pixel region is enlarged and illustrated. In FIG. 4 also, upper layers of the color filter array 11 are omitted in a similar manner to FIG. 3.

As shown in FIG. 4, in this example, a lattice-like light-shield region 15 is formed along the border between the adjacent color filters. The light-shield region 15 in this example also is a color filter similar to the light-shield region of FIG. 3. That is to say, the light-shield region 15 includes a colored film formed between the adjacent color filters and a resin with which a gap between the colored particles of this colored film is filled. This resin is colored in a complementary color or an opposed color of the color of the colored particles.

In the example of FIG. 4, the light-shield region 15 is formed by the following steps. Firstly, a plurality of colored films, arranged in a matrix corresponding to the respective photodiodes, are formed within the effective pixel region (see FIG. 2A). Next, a lattice-like resist pattern is formed along the border between the adjacent colored films, and a resin is applied at an aperture of the resist pattern (see FIG. 2B), and the resin is allowed to permeate into the colored films (see FIG. 2C). Further, the permeated resin is cured, whereby color filters 10a to 10c are formed (see FIG. 2D).

Thereafter, a resist pattern is formed so as to cover the color filters 10a to 10c, and then a resin colored in a complementary color or an opposed color of the color of the colored particles is applied at the aperture of the resist pattern, and this resin is allowed to permeate into the colored film. Further, the permeated resin is cured, whereby the light-shield region 15 can be obtained. Note here that, following the formation of the light-shield region 15, the color filters 10a to 10c may be formed.

In this way, according to the present example, the light-shield region 15 is formed so as to separate the adjacent color filters 10a to 10c. Therefore, according to the present example, the occurrence of mixed colors, resulting from the stray light from an adjacent pixel, can be suppressed. Since the mixed colors are likely to occur when the pixels are made smaller, the mode of FIG. 4 is effective for a smaller pixel size that is for increasing the number of pixels.

The above-described embodiments deal with the case where the solid-state imaging device is a CCD type solid-state imaging device. However, the present invention is not limited to this. In this present invention, the solid-state imaging device may be a MOS type solid-state imaging device. The present invention is applicable to any solid-state imaging device provided with a color filter without limitation. Further, even in the case where the solid-state imaging device of the present invention is a CCD type solid-state imaging device, the present invention is not limited to the examples of FIG. 1 to FIG. 4. In the present invention, an embodiment without an internal microlens also is possible, for example.

A solid-state imaging device and a method for manufacturing a solid-state imaging device of the present invention can be applied to imaging devices of a digital still camera and a digital video camera and image reading devices of a facsimile, a scanner and a copying machine. Therefore, the solid-state imaging device and the method for manufacturing a solid-state imaging device of the present invention have industrial applicability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   a plurality of light-receptive elements arranged in a matrix in a semiconductor substrate; and
   a plurality of color filters corresponding to the plurality of light-receptive elements, respectively,
   wherein the color filters comprise a colored film formed by depositing colored particles at a layer above the plurality of light-receptive elements, and a resin with which gaps between the colored particles are filled,
   the color filters are formed inside and outside of an effective pixel region of the solid-state imaging device, and
   in the color filters located outside of the effective pixel region, a resin with which gaps between the colored particles are filled is colored in a complementary color or an opposed color of a color of the colored particles.

2. A solid-state imaging device, comprising:
   a plurality of light-receptive elements arranged in a matrix in a semiconductor substrate; and
   a plurality of color filters corresponding to the plurality of light-receptive elements, respectively,
   wherein the color filters comprise a colored film formed by depositing colored particles at a layer above the plurality of light-receptive elements, and a resin with which gaps between the colored particles are filled,
   the plurality of color filters are arranged in a matrix so as to form a color fitter array,
   the color filter array comprises a lattice-like light-shield region that is formed along a border between adjacent color filters, and
   the light-shield region comprises a colored film formed by depositing colored particles between the adjacent color filters and a resin with which gaps between the colored particles are filled, the resin being colored in a complementary color or an opposed color of a color of the colored particles.

* * * * *